(12) United States Patent
Loy et al.

(10) Patent No.: US 12,201,039 B2
(45) Date of Patent: Jan. 14, 2025

(54) NON-VOLATILE MEMORY DEVICE WITH FILAMENT CONFINEMENT

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 603 days.

(21) Appl. No.: 17/400,121

(22) Filed: Aug. 12, 2021

(65) Prior Publication Data
US 2023/0052035 A1 Feb. 16, 2023

(51) Int. Cl.
*H10N 70/20* (2023.01)
*H10B 63/00* (2023.01)
*H10N 70/00* (2023.01)

(52) U.S. Cl.
CPC ............. *H10N 70/24* (2023.02); *H10B 63/00* (2023.02); *H10N 70/068* (2023.02); *H10N 70/8265* (2023.02); *H10N 70/841* (2023.02); *H10N 70/8416* (2023.02); *H10N 70/8833* (2023.02); *H10B 63/84* (2023.02); *H10N 70/063* (2023.02)

(58) Field of Classification Search
CPC .. H10N 70/841; H10N 70/063; H10N 70/068; H10N 70/8416; H10N 70/8833; H10N 70/24; H10B 63/84; H10B 63/00
See application file for complete search history.

(56) References Cited

U.S. PATENT DOCUMENTS

| | | | |
|---|---|---|---|
| 10,608,179 B2* | 3/2020 | Ando | H10N 70/8833 |
| 2011/0140067 A1* | 6/2011 | Chen | H10N 70/011 |
| | | | 257/4 |
| 2013/0121063 A1* | 5/2013 | Tsuji | H10N 70/24 |
| | | | 257/4 |
| 2014/0312296 A1* | 10/2014 | Jo | H10N 70/821 |
| | | | 257/4 |
| 2015/0041748 A1* | 2/2015 | Hayakawa | H10N 70/063 |
| | | | 257/2 |
| 2016/0079527 A1* | 3/2016 | Fest | H10N 70/063 |
| | | | 438/382 |
| 2020/0106013 A1* | 4/2020 | Strutt | H10N 70/063 |

FOREIGN PATENT DOCUMENTS

WO WO-2016105673 A1 * 6/2016 ......... G11C 13/0007

OTHER PUBLICATIONS

U.S. Appl. No. 17/026,303, Loy et al.
(Continued)

*Primary Examiner* — Ratisha Mehta
*Assistant Examiner* — Brad A Knudson
(74) *Attorney, Agent, or Firm* — David Cain

(57) ABSTRACT

A memory device and method of making the same is provided. The memory device includes a first electrode, an oxygen scavenging layer on the first electrode, a hard mask on the oxygen scavenging layer, and a second electrode on the hard mask. A switching layer is arranged on a portion of the oxygen scavenging layer, and the switching layer is conformal to a side surface of the hard mask.

19 Claims, 9 Drawing Sheets

(56) References Cited

OTHER PUBLICATIONS

Xiaoliang Zhong et al., The effect of Ta oxygen scavenger layer on HfO2-based resistive switching behavior: thermodynamic stability, electronic structure, and low-bias transport, Physical Chemistry Chemical Physics, 2016, Issue No. 10, pp. 7502-7510, Royal Society of Chemistry.
L. Goux et al., Asymmetry and Switching Phenomenology in TiN\(Al2O3)\HfO2\Hf Systems, ECS Solid State Letters, 2012, vol. 1—Issue No. 4, p. 63-p. 65, ECS.
Zhihua Yong et. al. "Tuning oxygen vacancies and resistive switching properties in ultra-thin HfO2 RRAM via TiN bottom electrode and interface engineering", Applied Surface Science, 2021, vol. 551, Issue No. 149386, pp. 1-13, Eslevier.
Muxi Yu et al. "Novel Vertical 3D Structure of TaOx-based RRAM with Self-localized Switching Region by Sidewall Electrode Oxidation", 2016, vol. 6, Issue No. 21020, Scientific Reports.

\* cited by examiner

NON-VOLATILE MEMORY DEVICE WITH FILAMENT CONFINEMENT

FIELD OF THE INVENTION

The present invention relates generally to integrated circuits and fabrication of integrated circuits, and more particularly to structures for a non-volatile memory device and methods of making non-volatile memory devices.

BACKGROUND

Semiconductor memory devices may generally be categorized into volatile memory devices and non-volatile memory devices. Volatile memory devices typically require a continuous supply of power to maintain stored information, whereas non-volatile memory devices are able to retain data even when powered off. Examples of volatile memory devices include static random-access memory (SRAM) and dynamic random-access memory (DRAM). Examples of non-volatile memory devices include flash memory, read-only memory (ROM), non-volatile random-access memory such as resistive random-access memory (ReRAM or RRAM).

A resistive random-access memory can store information via a resistive element between two conductive electrodes, the resistive element having a resistance value that can vary between a high resistance state and a low resistance state, corresponding to different logical values for data storage. For example, to write a logical "1" value, a switching voltage may be applied so as to form one or more filaments within the resistive element, creating a conductive path across the resistive element to provide a low resistance state. Conversely, a switching voltage may be applied to destroy the filaments, thereby removing the conductive path to provide a high resistance state.

However, due to variations in the filament formation and destruction process, the resistance values for the high and low resistance states can vary significantly. Consequently, switching voltages required to program the memory device so as to change the information storing states may also vary due to at least in part to the resistance variations as aforementioned.

Improved structures for non-volatile memory devices and methods for making such non-volatile memory devices are needed.

SUMMARY

According to an embodiment of the invention, a memory device comprises a first electrode and an oxygen scavenging layer on the first electrode. A hard mask is on the oxygen scavenging layer, the hard mask having a side surface. A second electrode is on the hard mask and a switching layer is arranged on a portion of the oxygen scavenging layer, the switching layer having a first portion conformal to the side surface of the hard mask.

According to another embodiment of the invention, a memory device comprises a first electrode, a second electrode over the first electrode, and a third electrode spaced from the first electrode and the second electrode. An oxygen scavenging layer is on the first electrode and third electrode, and a hard mask is on the oxygen scavenging layer and in contact with the second electrode. The hard mask has a side surface, and a switching layer is arranged on a portion of the oxygen scavenging layer, the switching layer having a first portion conformal to the side surface of the hard mask.

According to yet another embodiment of the invention, a method of fabricating a memory device is provided. The method includes forming a first electrode in an interlayer dielectric material and forming an oxygen scavenging layer on the first electrode. A hard mask is formed on the oxygen scavenging layer, the hard mask having a side surface. Thereafter, a switching layer is formed on a portion of the oxygen scavenging layer, wherein the switching layer has a first portion conformal to the side surface of the hard mask.

BRIEF DESCRIPTION OF THE DRAWINGS

The accompanying drawings illustrate examples of various non-limiting embodiments of the invention and constitute a part of the specification. The drawings, along with the above general description of the invention, and the following detailed description of the various embodiments, serve to explain the examples of the non-limiting embodiments of the invention. In the drawings, like reference numerals generally refer to like features in the various views.

Figure 1:
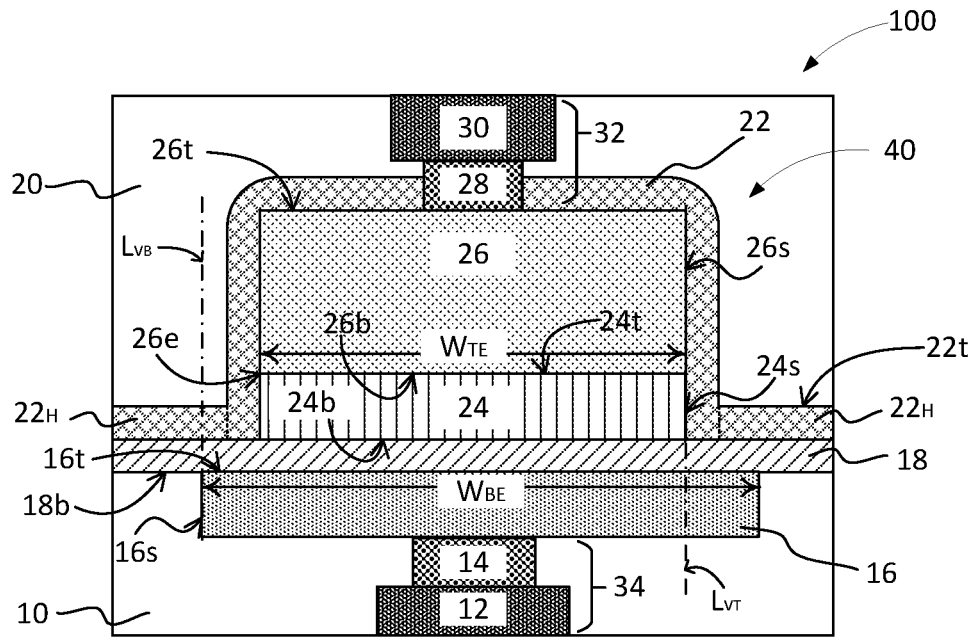
FIG. 1 shows a simplified cross-sectional view of a memory device according to an exemplary embodiment of the invention.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale and the dimensions of some of the elements in the drawings may be exaggerated relative to other elements to help improve understanding of the embodiments of the device.

DETAILED DESCRIPTION

Referring to FIG. 1, in accordance with exemplary embodiments of the invention, a memory device 100 is disposed in a metallization level of an interconnect structure fabricated by middle-of-line and back-end-of-line processing over a substrate. In some embodiments, memory device 100 may be a resistive switching random-access memory cell type, such as oxide random-access memory (Ox-Re-RAM or Ox-RRAM) or conductive-bridging random-access memory (CBRAM) as examples. The memory device 100 may be connected to one of the interconnect features 32, 34 within the interconnect structure, which may be in one of the metallization levels. For example, the top and bottom electrodes may be connected to other interconnect features for sending or receiving electrical inputs from other electronic components such as transistors or diodes, as non-limiting examples, in a memory device. The interconnect features may comprise a metallic material such as copper, cobalt, aluminum, or an alloy thereof, and the interconnect features may be one or more conductive lines, vias, contacts, islands, or the like, arranged in an interlayer dielectric material which may comprise one or more layers. Conductive lines may be source lines, bit lines, or word lines, and each conductive line may be connected to more than one top or bottom electrode, depending on the design requirements of the device. Referring to memory device 100, interconnect feature 34 may include via 14 disposed in an interlayer dielectric material 10 and coupled to a terminal connection, such as a source line 12 as an example. Similarly, interconnect feature 32 may include via 28 disposed in an interlayer dielectric material 20 and coupled to a different terminal connection, such as a bit line 30 as an example.

The memory device 100 includes a top electrode 26 arranged over a hard mask 24, a switching layer 22 adjacent to the hard mask 24, and a bottom electrode 16 arranged in an interlayer dielectric material 10. An oxygen scavenging layer 18 is arranged over the top surfaces of the bottom electrode 16 and the interlayer dielectric material 10, separating the top electrode 26 and the hard mask 24 from the bottom electrode 16.

The hard mask 24 is arranged on a portion of the oxygen scavenging layer 18, the hard mask 24 having a thickness, a bottom surface 24b in contact with the oxygen scavenging layer 18, a top surface 24t opposite the bottom surface 24b, and at least one side surface 24s. In an embodiment, the bottom surface 24b of the hard mask 24 may be in direct contact with the oxygen scavenging layer 18. The hard mask 24 may be composed of a suitable dielectric material, preferably a nitride, such as silicon nitride ($Si_3N_4$), and may be patterned by lithographic and etching techniques. The thickness of the hard mask 24 may be in the range of 5 nm to 20 nm.

The switching layer 22 is arranged on at least a portion of the oxygen scavenging layer 18, adjacent to the hard mask 24, and spaced apart from the bottom electrode 16 by the oxygen scavenging layer 18. The switching layer 22 may have a nominally uniform thickness and conformally cover a side surface 24s of the hard mask 24. The term "conformal" may refer to when a material layer conforms to or follows the contours of the surface that the material layer is in direct contact with, while maintaining a relatively uniform thickness over the surface. The switching layer 22 may extend vertically to at least partially cover a side surface 26s of the top electrode 26, or extend horizontally to cover a larger portion of the top surface of the oxygen scavenging layer 18. In an example of an embodiment, a portion of the switching layer 22 may extend to cover a top surface 26t of the top electrode 26. In another example, the switching layer 22 may have a horizontal portion $22_H$ extending over the top surface of the oxygen scavenging layer 18, the horizontal portion $22_H$ having a substantially planar top surface 22t. In FIG. 1, the horizontal portion $22_H$ is demarcated by dotted lines for easy visual identification and may not need to be physically separate from the portion of switching layer 22 adjacent to the hard mask 24. Suitable materials for the switching layer 22 comprise a metal oxide, such as magnesium oxide (MgO), tantalum oxide ($TaO_2$), hafnium oxide ($HfO_2$), titanium oxide ($TiO_2$), aluminum oxide ($AlO_2$ or $Al_2O_3$), or silicon dioxide ($SiO_2$). The thickness of the switching layer 22 may be in the range of 2 nm to 10 nm, more preferably between 5 nm to 10 nm.

The oxygen scavenging layer 18 may include materials that can consume, getter, deplete, or react with oxygen ions from a given environment, and may be in the form of compounds, compositions, multilayers, or thin films as the case may be. Examples of suitable materials for the oxygen scavenging layer 18 include metal oxides, such as magnesium oxide (MgO), tantalum oxide ($TaO_2$), titanium oxide ($TiO_2$), tungsten (W), hafnium oxide ($HfO_2$), and aluminum oxide ($AlO_2$ or $Al_2O_3$), or silicon dioxide ($SiO_2$). The choice of materials for each of the oxygen scavenging layer 18, switching layer 22, and the hard mask 24 may depend on the materials selected for the other two layers. In an exemplary embodiment, the oxygen scavenging layer 18 may be a different material from that of the switching layer 22. In another exemplary embodiment, the oxygen scavenging layer 18 may be a different material from that of the hard mask 24. In yet another exemplary embodiment, the oxygen scavenging layer 18 may be a different material from that of the switching layer 22, and the oxygen scavenging layer 18 may be a different material from that of the hard mask 24. The thickness of the oxygen scavenging layer 18 may be thinner than the thickness of the switching layer 22. For example, the thickness of the oxygen scavenging layer 18 may be in the range of 1 nm to 3 nm, more preferably around 2 nm.

The top electrode 26 is spaced apart from the bottom electrode 16 by the hard mask 24 and the oxygen scavenging layer 18. The top electrode 26 has a bottom surface 26b in direct contact with the top surface 24t of the hard mask 24. In one embodiment, the top surface 24t of the hard mask 24 may have substantially the same size as the bottom surface 26b of the top electrode 26, for example, the top electrode edge or corner 26e may be proximate to the hard mask side surface 24s. In another embodiment, the top surface 24t may be smaller than the bottom surface 26b such that the top electrode 26 overhangs the hard mask 24 on at least one side, in which the top electrode edge or corner 26e may be spaced from the hard mask side surface 24s, as an example. The bottom electrode 16 may have a top surface substantially coplanar with a top surface of interlayer dielectric material 10. In an exemplary embodiment, the top surface of the bottom electrode 16 is covered by the oxygen scavenging layer 18. For example, the top surface 16t of the bottom electrode 16 may be smaller than the bottom surface 18b of the oxygen scavenging layer 18. In another exemplary embodiment, the oxygen scavenging layer 18 extends to cover both of the top surfaces of the interlayer dielectric material 10 and the bottom electrode 16. In some embodiments, the top electrode 26 may be aligned to laterally overlap with the bottom electrode 16. For example, a vertical line $L_{VT}$ drawn from the side surface 26s of the top electrode may cut through the bottom electrode 16. In another example, a vertical line $L_{VB}$ drawn from the side surface 16s of the bottom electrode 16 may cut through the top electrode 26. In other embodiments, the top electrode 26 and bottom electrode 16 may be aligned to have no lateral overlap, but be sufficiently proximate to enable filament formation in at least one of the oxygen scavenging layer 18 or the switching layer 22 positioned between the top electrode 26 and the bottom electrode 16. For example, the displacement of the top electrode edge or corner 26e from the bottom electrode 16, for example, a bottom electrode edge or corner, may be about or less than 50 nm to enable optimal filament formation between the two electrodes. The smaller the displacement of the top electrode edge or corner 26e from the bottom electrode 26, the switching voltage may be advantageously reduced to a lower voltage. The top electrode 26 may have a width $W_{TE}$ and the bottom electrode 16 may have a width $W_{BE}$. In some embodiments, the top electrode width $W_{TE}$ may be shorter than or at least equal to the bottom electrode width $W_{BE}$. In other embodiments, the top electrode width $W_{TE}$ may be longer than the bottom electrode width $W_{BE}$.

The top and bottom electrodes 26, 16, may comprise an electrically conductive material, for example, a metal or an alloy thereof. The material choice for the top electrode 26 may be selected based on factors such as oxidation resistance and work function difference relative to the bottom electrode. In an exemplary embodiment, the top electrode 26 may be an active electrode while the bottom electrode 16 may be an inert electrode. In some other embodiments, the top electrode 26 may be an inert electrode while the bottom electrode 16 may be an active electrode. An active electrode may be composed of a suitable conductive material capable of being oxidized and/or reduced (i.e., redox reactions) to generate electric charges for the formation of the conductive paths. Non-limiting examples of suitable conductive material for the active electrode may include tantalum (Ta), hafnium (Hf), titanium (Ti), copper (Cu), silver (Ag), cobalt (Co), tungsten (W), or an alloy thereof. An inert electrode may be composed of a suitable conductive material being resistant to redox reactions. Non-limiting examples of suitable conductive material for the inert electrode may include ruthenium (Ru), platinum (Pt), titanium nitride (TiN), tantalum nitride (TaN). In some embodiments, the top electrode 26 may have a thickness within the range of 5-10 nm, while the bottom electrode 16 may have a thickness within the range of 5-30 nm. The electrode acting as the active electrode may have a thickness which is at least equal to the thickness of the electrode acting as the inert electrode, so as to provide sufficient layers of atoms required for redox reactions to form sufficient oxygen vacancies. For example, the thickness of the top electrode 26 as an active electrode may be greater than or equal to the thickness of the bottom electrode 16 as an inert electrode.

In use, voltages may be applied to the top and bottom electrodes through the conductive lines, in order to read, write or erase the memory device. Referring to memory device 100, according to an aspect of the exemplary embodiment, the bottom electrode 16 may act as the active electrode and the top electrode may act as the inert electrode. The memory device 100 may act as part of a single bitcell 40 including a transistor or diode (not shown) that may be coupled to at least one of the top or bottom electrodes. The bitcell 40 may then be programmed upon application of selected voltages to the relevant electrodes as desired. When a potential difference is applied across the two electrodes via the application of selected voltages to each of the electrodes, one or more conductive filaments may be formed in at least a portion of the switching layer 22 between the top electrode 26 and bottom electrode 16, thereby putting the memory device into a low resistance state (LRS). When the applied potential is reversed such that the conductive filaments can no longer be maintained between the two electrodes and thereby rupturing the conductive path therebetween, the memory device may then be placed into a high resistance state (HRS). Confinement of the conductive filaments to a specific region of the switching layer 22 by intentional design allows for faster switching behavior between high resistance state (HRS) and low resistance state (LRS), leading to faster reading, writing, and erasing speeds of the memory device, as opposed to conductive filaments forming randomly within the switching layer in an unpredictable manner. The oxygen scavenging layer 18 between the top and bottom electrodes at the vicinity of the switching layer 22 may additionally induce a movement of ions from the switching layer 22 towards the active bottom electrode 16, thereby completing the conductive path between the top and bottom electrodes. For example, the oxygen scavenging layer 18 may scavenge oxygen ions from the switching layer 22 to increase the concentration or density of oxygen vacancies in the switching layer 22. The scavenged oxygen ions may then drift from the oxygen scavenging layer 18 to the active electrode 16 to complete the conductive path between the top and bottom electrodes.

Figure 2:
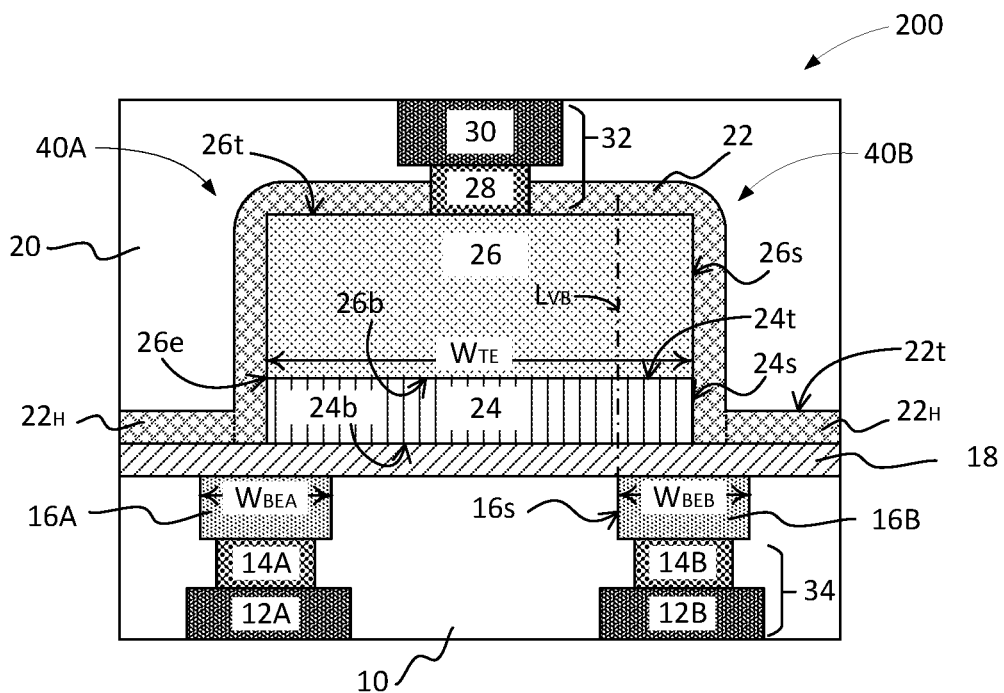
FIG. 2 shows a simplified cross-sectional view of an alternative embodiment according to another aspect of the invention.

Referring now to FIG. 2 in which like reference numerals refer to like features in FIG. 1 and which shows an exemplary cross-section view of memory device 200 in accordance with an alternative embodiment. Memory device 200 may include features similar to memory device 100, including top electrode 26, oxygen scavenging layer 18, switching layer 22, hard mask 24, and interlayer dielectric materials 10, 20 as already described and need not be repeated here. Compared to memory device 100, the memory device 200 includes two bottom electrodes, 16A and 16B electrically insulated from each other by the interlayer dielectric material 10, and both bottom electrodes being in contact with the same oxygen scavenging layer 18. The bottom electrodes 16A and 16B may have top surfaces substantially coplanar with the top surface of interlayer dielectric material 10. Memory device 200 may be coupled to a different transistor or diode (not shown) for each of the bottom electrodes, thus acting as two bitcells 40A, 40B which may be separately programmed by application of different voltages to each of the bottom electrodes, while the top electrode is maintained at a desired voltage. The top electrode 26 may have a width Wm and the bottom electrodes 16A, 16B may each have a width $W_{BEA}$ and $W_{BEB}$. The widths $W_{BEA}$ and $W_{BEB}$ may be the same or may be different depending on the design requirements. In some embodiments, the top electrode width Wm may be longer than or at least equal to one of the bottom electrode widths, $W_{BEA}$ or $W_{BEB}$. In other embodiments, the top electrode width $W_{TE}$ may be shorter than the one of the bottom electrode widths, $W_{BEA}$ or $W_{BEB}$.

Figure 3A:
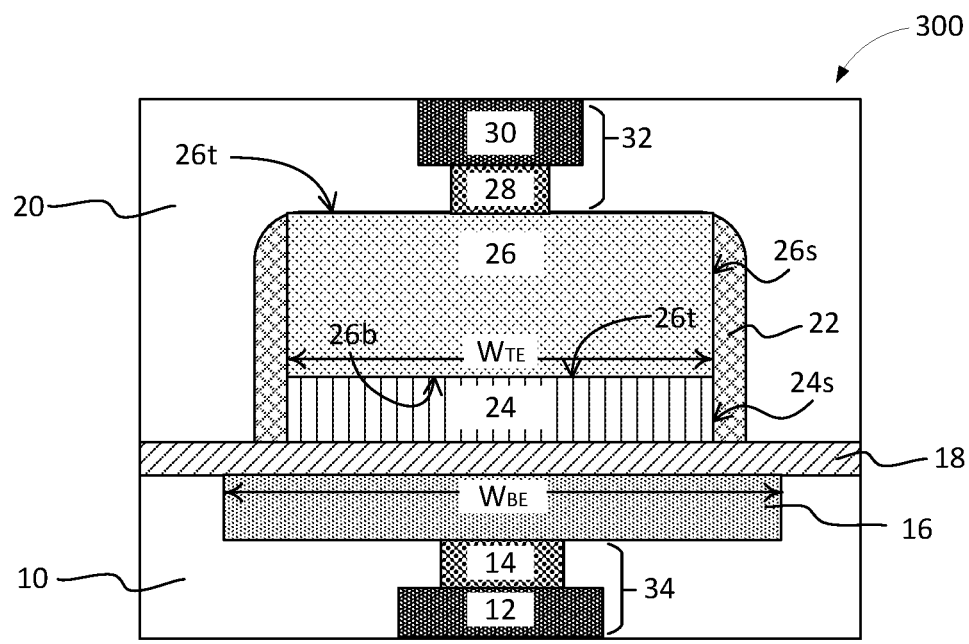
FIG. 3A shows a simplified cross-sectional view of another alternative embodiment taken generally along line X-X' in FIG. 3B which shows a corresponding simplified top-down view of the embodiment according to another aspect of the invention.

With reference to FIG. 3A, in which like reference numerals refer to like features in FIG. 1, a memory device 300 is provided in accordance with an alternative embodiment. Compared to memory device 100, the memory device 300 includes a switching layer 22 formed as a spacer structure on a portion of the oxygen scavenging layer 18, adjacent to a side surface 24s of the hard mask 24 and the top electrode 26. For example, the spacer structure of the switching layer 22 may have a side surface having a curved top portion extending down to a substantially vertical bottom portion. The switching layer 22 is in direct contact with the oxygen scavenging layer 18 and is conformal to the side surface 24s of the hard mask 24. The top surface 26t of the top electrode 26 is devoid of the switching layer 22. In some embodiments, the switching layer 22 may cover the entire side surface 26s of the top electrode 26. In other embodiments, the switching layer 22 may instead partially cover the side surface 26s of the top electrode 26.

Figure 3B:
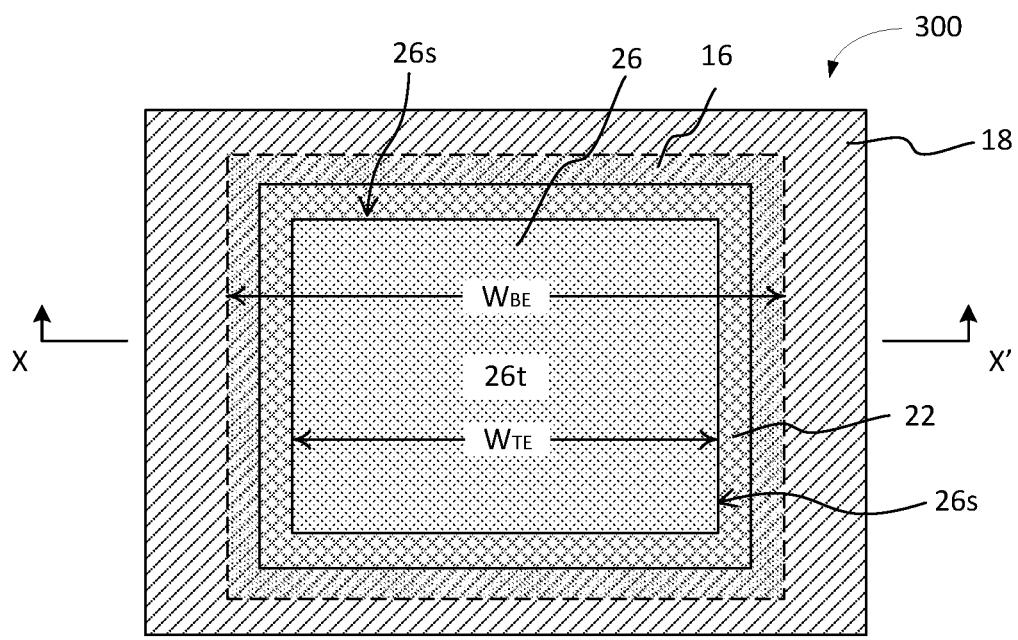

Referring now to FIG. 3B in which like reference numerals refer to like features in FIG. 3A and which shows an exemplary top-down view of memory device 300 where FIG. 3A is taken along line X-X'. The interconnect features 28, 30, and dielectric layers 10, 20, have been omitted from FIG. 3B so as not to obscure the features being described herein. The top surface 26t of the top electrode 26 may be devoid of the switching layer 22. The spacer structure of the switching layer 22 may be in the shape of a closed rectangular or polygonal annulus surrounding the side surfaces 26s of the top electrode 26. The bottom electrode 16 is below the oxygen scavenging layer 18 and is depicted by dotted outlines. The shapes of the top electrode 26 and the bottom electrode 16 may be polygonal having at least edges or corners, including rectangles, squares, triangles, diamonds, as non-limiting examples. In an exemplary embodiment, the top electrode 26 may be patterned to have an area smaller than bottom electrode 16. In another example, the top electrode 26 may have an area substantially equal to or larger than the bottom electrode 16.

Figure 4A:
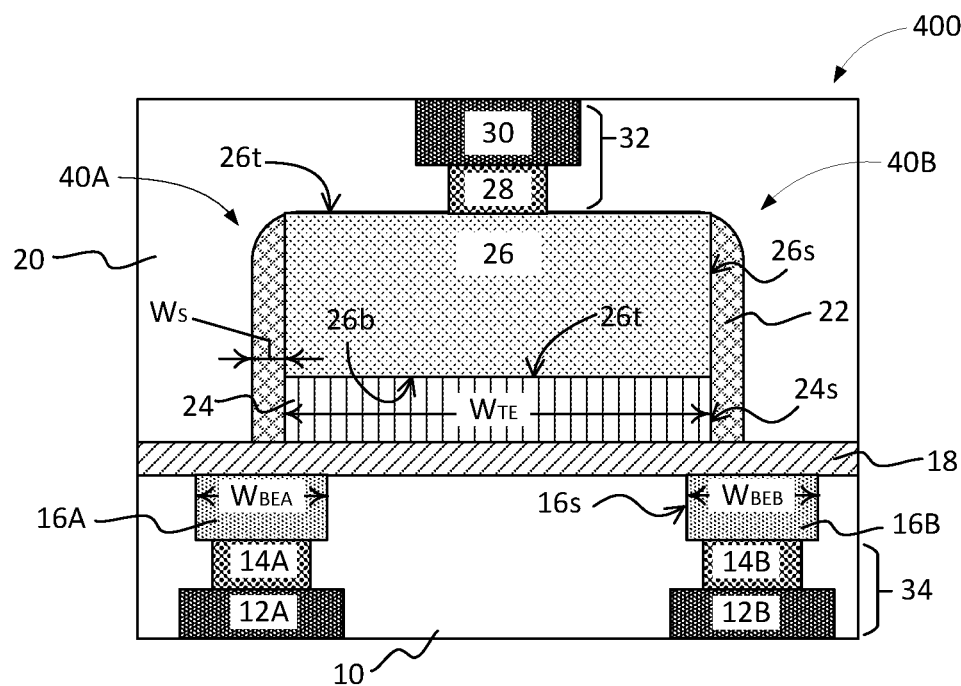
FIG. 4A shows a simplified cross-sectional view of yet another alternative embodiment taken generally along line Y-Y' in FIG. 4B which shows a corresponding simplified top-down view of the embodiment according to another aspect of the invention.
Figure 4B:
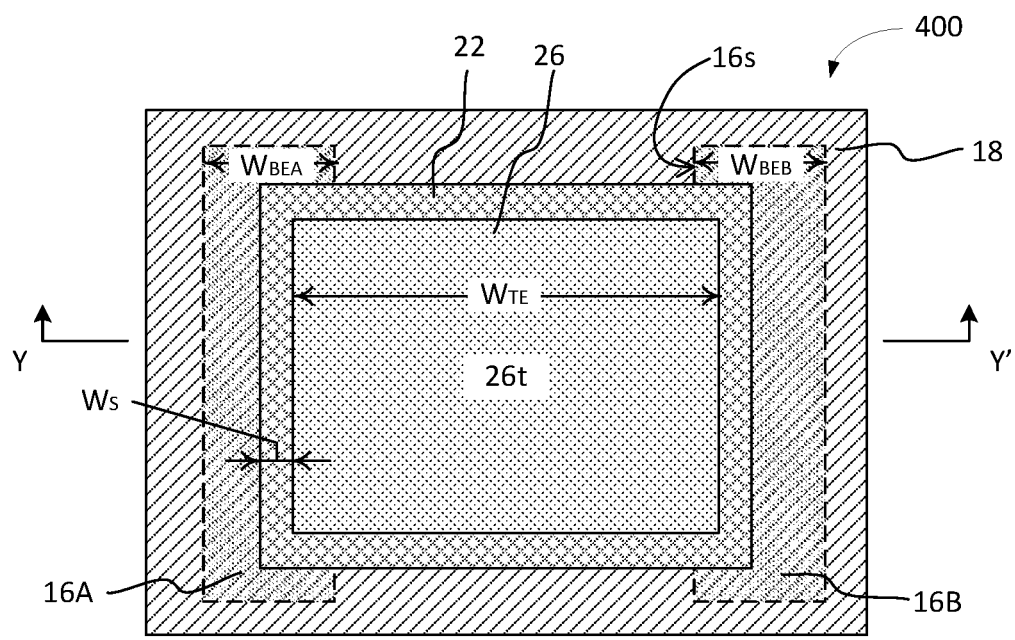

With reference to FIGS. 4A and 4B in which like reference numerals refer to like features in FIGS. 3A and 3B, a memory device 400 will be described in accordance with an alternative embodiment. Memory device 400 may include features similar to memory device 300 but may be modified to have two bottom electrodes 16A and 16B being in contact with the same oxygen scavenging layer 18. The two bottom electrodes 16A and 16B are electrically insulated from each other by the interlayer dielectric material 10, and each of the bottom electrodes have top surfaces that are substantially coplanar with the top surface of the interlayer dielectric material 10. Each of the bottom electrodes may be coupled to a different transistor or diode (not shown), thus providing two bitcells 40A, 40B which may be separately programmed by applying selected voltages to each of the bottom electrodes. In FIG. 4B, the bottom electrodes 16A and 16B below the oxygen scavenging layer 18 are depicted by dotted outlines. The bottom electrodes 16A and 16B may be polygonal in shape, having at least edges or corners, including rectangles, squares, triangles, diamonds, as non-limiting examples. The top electrode 26 may be arranged to overlap with at least one edge or side surface 16s of the bottom electrode 16A and 16B. In an alternative embodiment, the top electrode 26 may be positioned such that there is no overlap with at least one of the bottom electrodes but the top and bottom electrodes have an edge or side surface sufficiently proximate to each other such that filament formation in the switching layer between the top electrode and the bottom electrode can still be enabled when a potential difference is applied between the two electrodes. For example, the displacement or shortest distance between the top and bottom electrodes may be 50 nm for optimal filament formation between the electrodes. In another example, the top electrode may be laterally displaced from one or both of the bottom electrodes by not more than the width $W_S$ of the switching layer 22. The width of the switching layer 22 is measured from the side surface of the switching layer 22 that is in direct contact with the top electrode side surface 26s, to the furthest opposing side surface of the switching layer 22.

Figure 5:
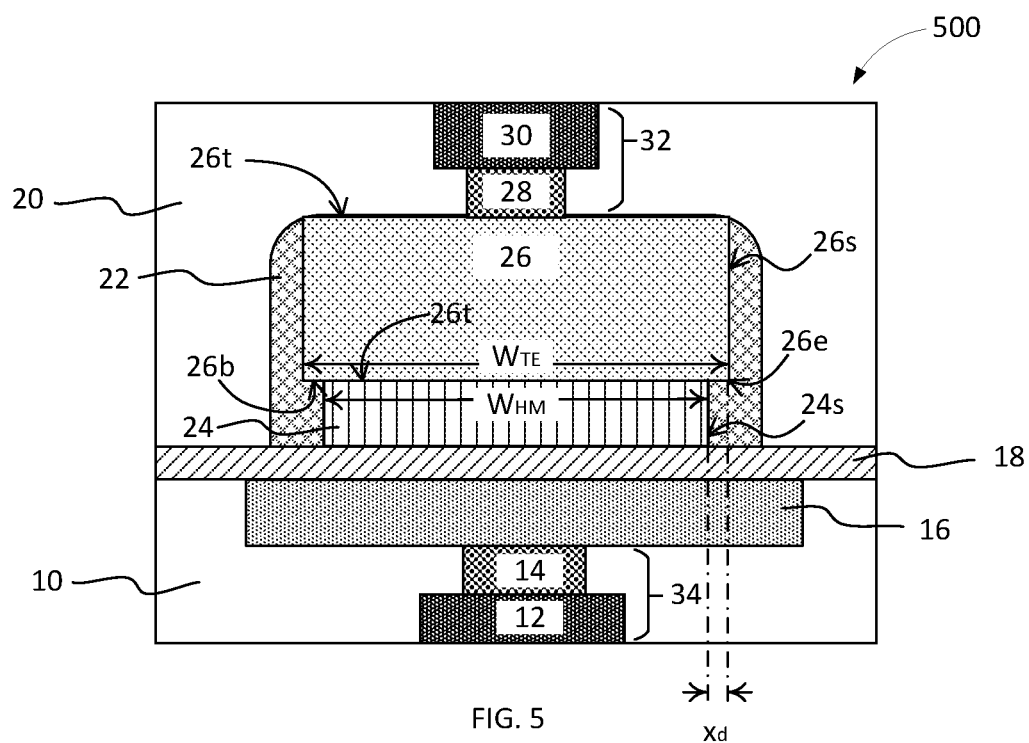
FIG. 5 shows a simplified cross-sectional view of yet another alternative embodiment according to another aspect of the invention.

Referring now to FIG. 5 in which like reference numerals refer to like features in FIG. 3 and a memory device 500 in accordance with an alternative embodiment will now be described. Memory device 500 may include features similar to memory device 300, including top electrode 26, bottom electrode 16, oxygen scavenging layer 18, switching layer 22, and interlayer dielectric materials 10, 20. Compared to memory device 300, memory device 500 has a hard mask width $W_{HM}$ that is shorter than the top electrode width $W_{TE}$. For example, the bottom surface 26b of the top electrode 26 may be larger than the top surface 24t of the hard mask 24, resulting in an overhang of the top electrode 26 over the side surfaces 24s of the hard mask 24. The side surface 24s of the hard mask 24 may be recessed from the side surface 26s of the top electrode 26 by a width $x_d$ on one or more sides of the hard mask. The width $x_d$ may be in the range of 2 nm to 3 nm. The resulting structure provides an overhanging top electrode edge or corner, 26e, spaced from the side surfaces 24s and in contact with the switching layer 22.

Figure 6:
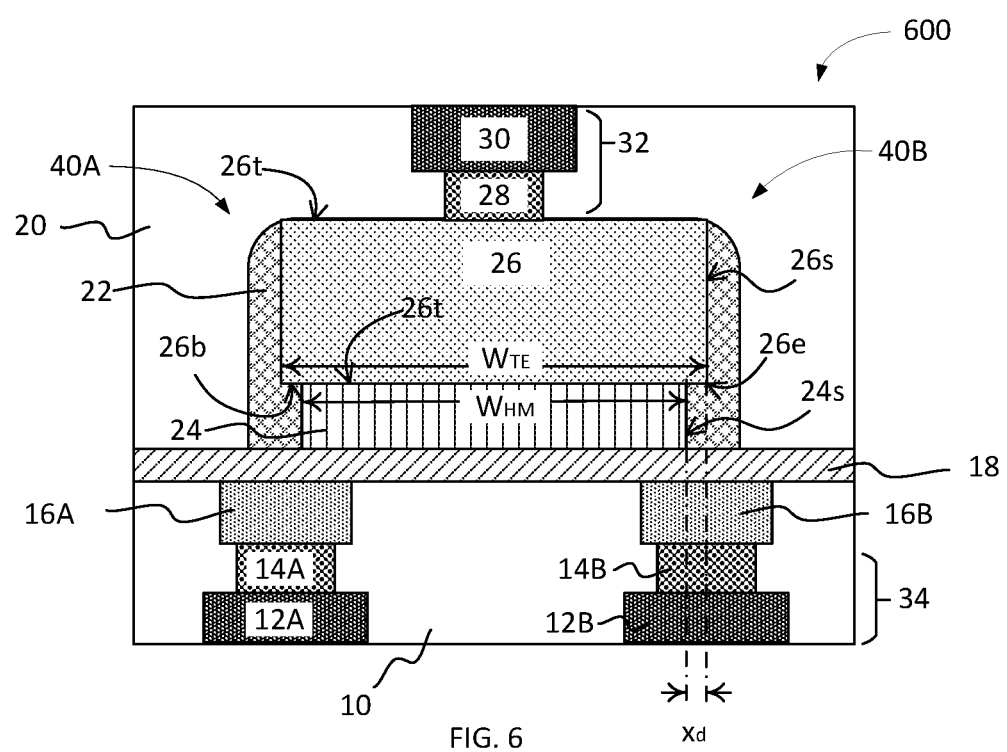
FIG. 6 shows a simplified cross-sectional view of yet another alternative embodiment according to another aspect of the invention.

Referring now to FIG. 6 in which like reference numerals refer to like features in FIG. 5 and which shows an exemplary cross-section view of memory device 600 in accordance with an alternative embodiment. Memory device 600 may include features similar to memory device 500 but may be modified to include two bottom electrodes, 16A and 16B instead of the single bottom electrode 16 of memory device 500. Similar to the two bottom electrodes of memory device 200, each of the bottom electrodes is electrically isolated from each other and may be coupled to a different transistor or diode (not shown), thus providing two bitcells 40A, 40B which may be separately programmed by application of different voltages to each of the bottom electrodes.

Figure 7:
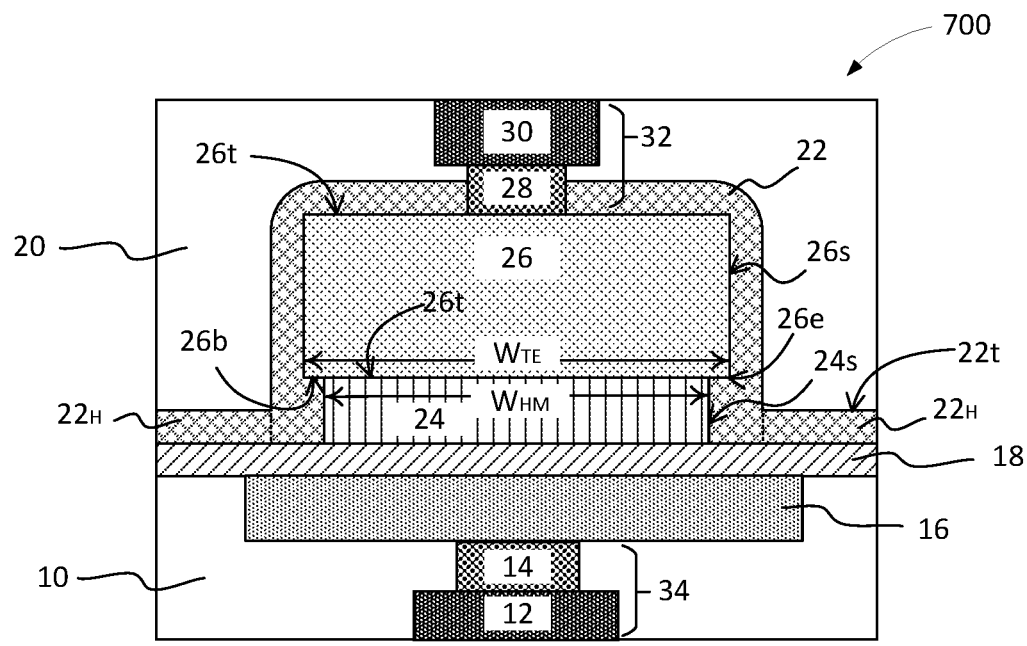
FIG. 7 shows a simplified cross-sectional view of yet another alternative embodiment according to another aspect of the invention.

Referring now to FIG. 7 in which like reference numerals refer to like features in FIG. 5, in accordance with an alternative embodiment, an exemplary memory device 700 may include features similar to memory device 500, as already described and need not be repeated here. Compared to memory device 500, a portion of the switching layer 22 in the memory device 700 may extend to cover a top surface 26t of the top electrode 26. In another example, the switching layer 22 may have a horizontal portion $22_H$ extending over the top surface of the oxygen scavenging layer 18, the horizontal portion having a substantially planar top surface $22t$.

Figure 8:
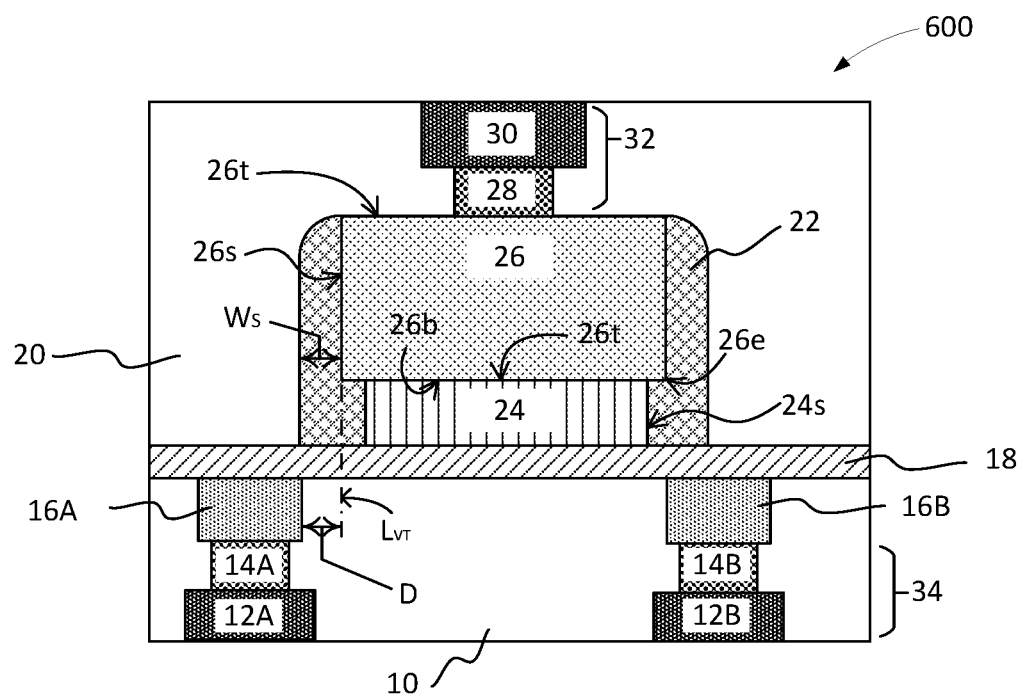
FIG. 8 shows a simplified cross-sectional view of yet another alternative embodiment according to another aspect of the invention.

With reference to FIG. 8 in which like reference numerals refer to like features in FIG. 6, in accordance with an exemplary embodiment, memory device 600 may be presented with the top electrode 26 being laterally displaced from at least one of the bottom electrodes, for example, bottom electrode 16A, such that the lateral displacement D is not more than the width $W_S$ of the switching layer. The lateral displacement D is the shortest distance between a vertical line $L_{VT}$ drawn from a side surface 26s of the top electrode to a side surface 16s of the bottom electrode 16A. The width $W_S$ of the switching layer 22 is the horizontal displacement between the side surface of the switching layer 22 in direct contact with the top electrode side surface 26s, and the furthest opposing side surface of the switching layer 22. Filament formation between the top electrode 26 and bottom electrode 16A may still be enabled through the switching layer 22 and the oxygen scavenging layer 18, between the top electrode 26 and the bottom electrode 16A.

FIGS. 9A through 9D illustrate an exemplary process for making various embodiments of the invention, such as in FIGS. 1 and 2. First referring to FIG. 9A, bottom electrodes 16A and 16B are formed over respective interconnect features 34, and one or more layers of interlayer dielectric material 10 are deposited to surround and electrically isolate the two bottom electrodes from each other. A material removal process, such as a chemical mechanical planarization (CMP) process may be performed so that the top surfaces of the bottom electrodes 16A, 16B, are substantially level with the top surface of the interlayer dielectric material 10, forming a substantially planar surface for subsequent processing. An oxygen scavenging layer 18 may then be deposited over the substantially planar top surfaces of the bottom electrodes 16A, 16B, and the interlayer dielectric material 10, using a suitable deposition technique such as chemical vapor deposition (CVD), as an example.

Figure 9A:
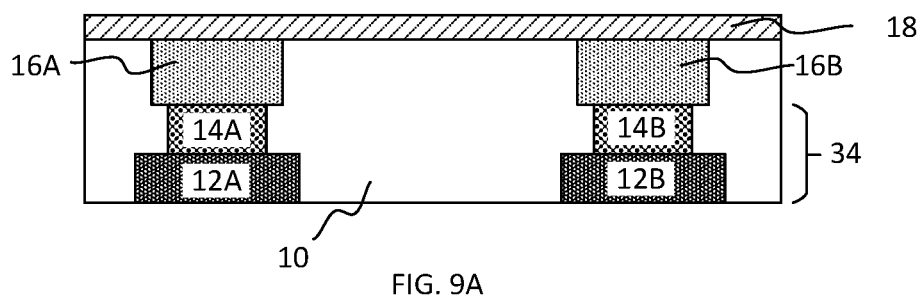
FIGS. 9A-9D show simplified cross-sectional views representing exemplary process steps for fabricating a memory device, according to an embodiment of the invention.
Figure 9B:
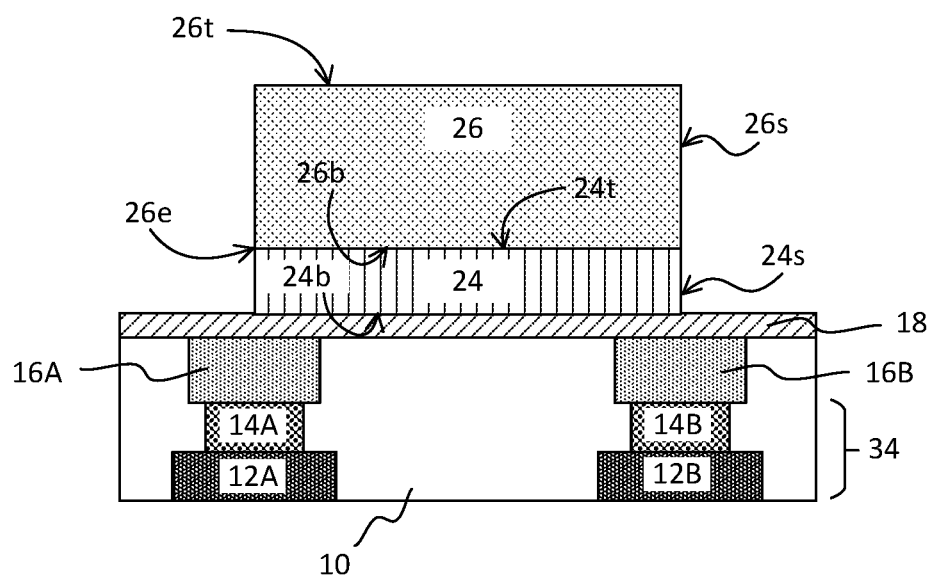

Referring now to subsequent processing steps in FIG. 9B, a layer of hard mask material is deposited over the top surface of the oxygen scavenging layer 18, followed by a layer of conductive material selected for the top electrode 26. As an example, the hard mask material may include a dielectric material, such as silicon dioxide or silicon nitride, deposited by a suitable deposition technique such as chemical vapor deposition (CVD). The conductive material for the top electrode may be deposited over the top surface of the hard mask material by physical vapor deposition (PVD), or any other suitable process. The material stack comprising the conductive material over the hard mask material may then be patterned by lithography and etching processes to define the top electrode 26 over the hard mask 24, and thereby exposing the top surface of the oxygen scavenging layer 18 in regions that are uncovered by the hard mask 24. As part of the patterning process, another patterning hard mask layer (not shown) may be utilized together with a material removal process such as a reactive ion etching (RIE) process, and subsequently removed from the top surface 26t of the top electrode 26. The patterning hard mask may shield a portion of the conductive material and hard mask material underneath the patterning hard mask, such that the material removal process may remove conductive material and hard mask material that are unshielded by the patterning hard mask. It is understood that process limitations may result in slightly sloped sidewalls for the top electrode 26 and the hard mask 24, as well as rounded edges or corners, in certain instances.

Figure 9C:
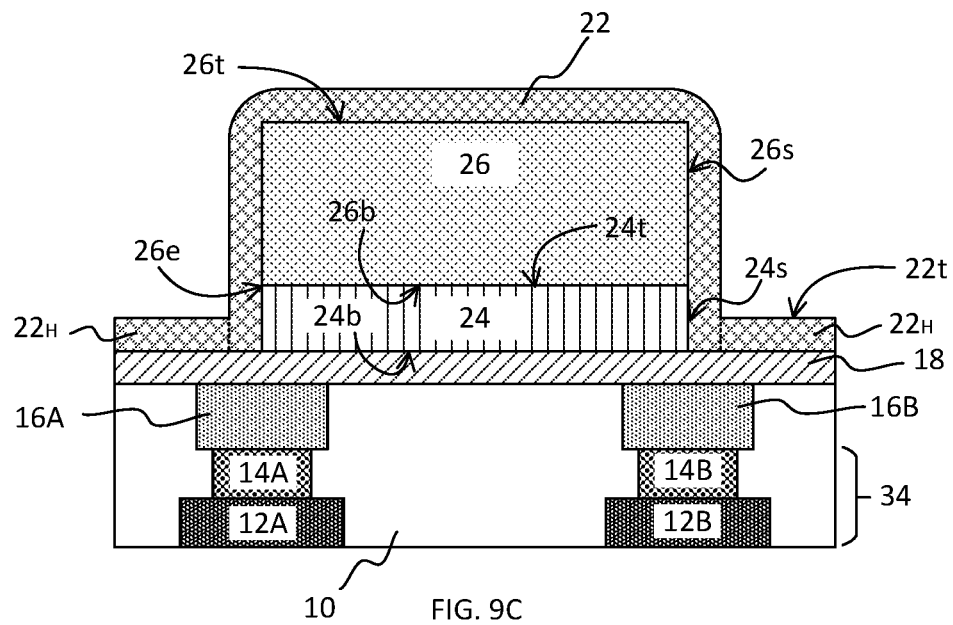

FIG. 9C depicts the memory device after subsequent processing steps in which a switching layer 22 may be conformally deposited over top surface 26t of the top electrode, the side surfaces 24s and 26s of the hard mask 24 and top electrode 26 respectively, and the top surface of the oxygen scavenging layer 18 that was exposed in the previous processing steps. The switching layer 22 may be formed to have a horizontal portion $22_H$ extending over the top surface of the oxygen scavenging layer 18, the horizontal portion $22_H$ having a substantially planar top surface 22t. Suitable conformal deposition methods may include but not limited to atomic layer deposition (ALD) and chemical vapor deposition (CVD). Referring now to FIG. 2, the process may continue with the formation of interconnect features such as via 28 and bit line 30, and deposition of interlayer dielectric material 20 to form the memory device 200.

Figure 9D:
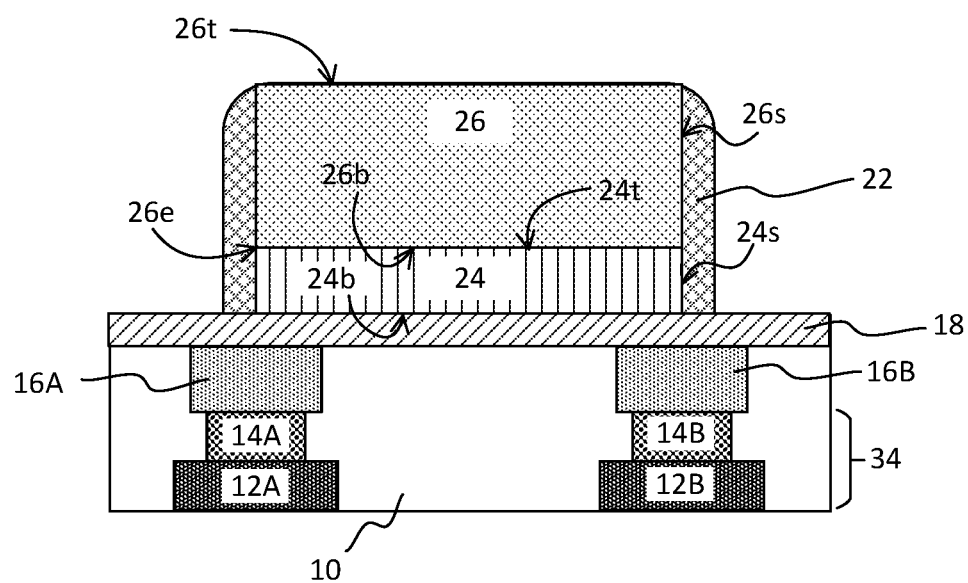

Referring now to alternative processing steps in FIG. 9D which continues from FIG. 9C, a material removal process may be applied to remove part of the switching layer 22 over the top surface 26t of the top electrode and the horizontal portion $22_H$ over the oxygen scavenging layer 18, so as to form various alternative embodiments such as FIG. 3A. & FIG. 4A. The resulting switching layer 22 may have a spacer structure on a portion of the oxygen scavenging layer 18, being conformal to the side surfaces of the hard mask 24 and the top electrode 26. A suitable material removal process may be an anisotropic etching process, for example, a "spacer etch" process that preferentially removes more material in the vertically downward direction compared to the lateral direction. Subsequently, the process may continue with the formation of interconnect features such as via 28 and bit line 30, and deposition of interlayer dielectric material 20 to form the memory device 400 in FIG. 4A.

Figure 10A:
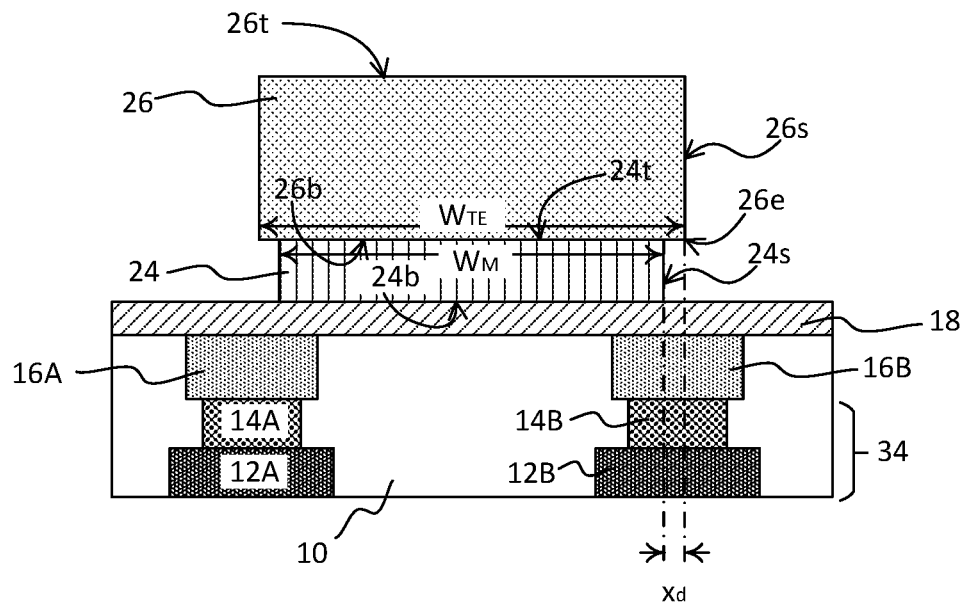
FIG. 10A-10C show simplified cross-sectional views representing exemplary process steps for fabricating a memory device, according to another embodiment of the invention.
Figure 10B:
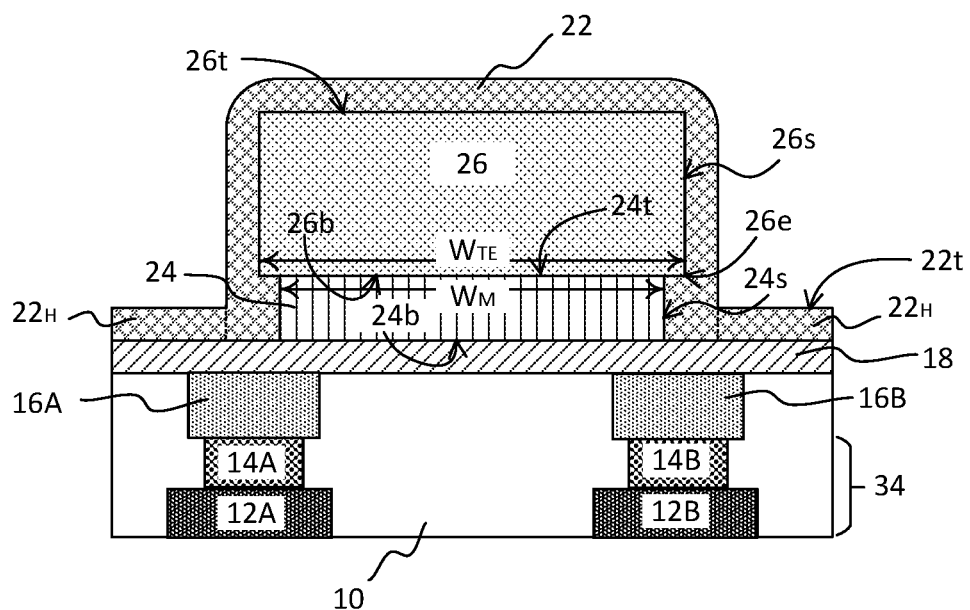
Figure 10C:
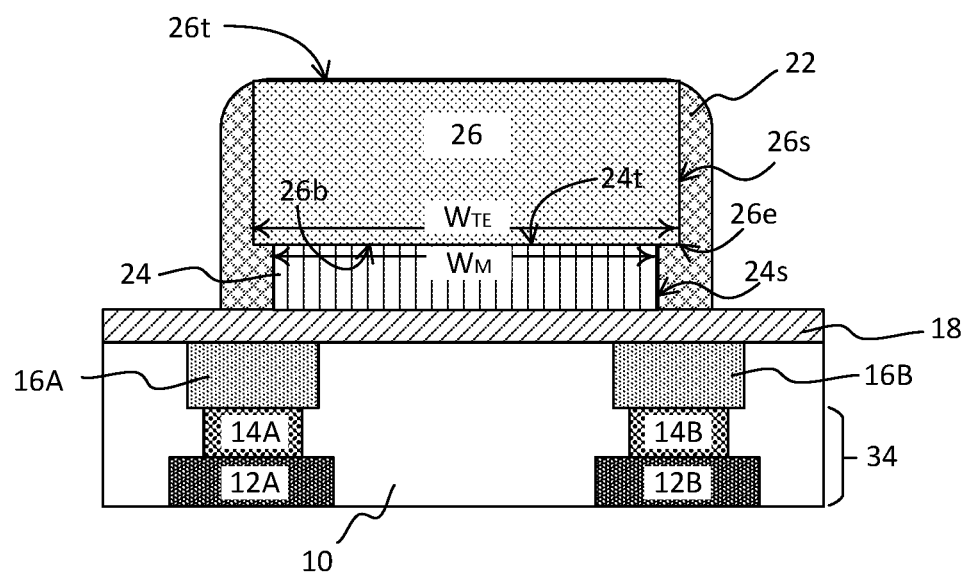

FIGS. 10A through 10C illustrate an alternative exemplary process of forming the top electrode 26 and hard mask 24 for various embodiments shown in FIGS. 5-7. FIG. 10A may continue from FIG. 9B and shows a subsequent processing stage after the process of patterning the material stack comprising the conductive material over the hard mask material to define the top electrode 26 over the hard mask 24, and exposing the top surface of the oxygen scavenging layer 18 adjacent to the defined hard mask 24. The top electrode 26 over the hard mask 24 may be further subjected to a material removal process that may be tuned to achieve more material removal in the lateral direction for the hard mask material, for example, recessing the side surface 24s of the hard mask 24 further inwards by a width $x_d$ than the side surface 26s of the top electrode 26. A suitable material removal process for recessing the side surface 24s of the hard mask 24 may include a wet etch process. This results in the hard mask width $W_{HM}$ being shorter than the top electrode width $W_{TE}$, or the bottom surface 26b of the top electrode 26 being larger than the top surface 24t of the hard mask 24. This also leads to a resulting structure having the top electrode 26 overhanging over the side surfaces 24s of the hard mask 24, providing a top electrode edge or corner 26e which is spaced from the side surfaces 24s of the hard mask 24.

Referring now to FIG. 10B which shows subsequent processing steps in which a switching layer 22 may be conformally deposited over the top surface 26t of the top electrode, the side surfaces 24s and 26s of the hard mask 24 and top electrode 26 respectively, and over the top surface of the oxygen scavenging layer 18 not covered by the hard mask 24. The top electrode edge or corner 26e is in contact with the switching layer 22. The switching layer 22 may be formed to have a horizontal portion $22_H$ extending over the top surface of the oxygen scavenging layer 18, the horizontal portion $22_H$ having a substantially planar top surface 22t. Suitable conformal deposition methods may include but not limited to atomic layer deposition (ALD) and chemical vapor deposition (CVD). The process may thereafter continue with the formation of interconnect features such as via 28 and bit line 30, and deposition of interlayer dielectric material 20 to form the memory device 700 shown in FIG. 7.

FIG. 10C shows alternative processing steps which continue from FIG. 10B for various alternative embodiments in FIGS. 5 and 6. A material removal process may be applied to remove part of the switching layer 22 over the top surface 26t of the top electrode and the horizontal portion $22_H$ over the oxygen scavenging layer 18, so as to form the resulting switching layer 22 having a spacer structure on a portion of the oxygen scavenging layer 18, being conformal to the side surfaces of the hard mask 24 and the top electrode 26. A suitable material removal process may be an anisotropic etching process, for example, a "spacer etch" process as previously described. Subsequently, the process may continue with the formation of interconnect features such as via 28 and bit line 30, and deposition of interlayer dielectric material 20 to form the memory device 600 in FIG. 6.

Descriptions of embodiments herein are meant to be taken as examples and not meant to be limiting as such. Terms such as "vertical", "horizontal", "top", "bottom", "over", "under", and the like in the description and in the claims, if any, are used for establishing a frame of reference and not necessarily for describing permanent relative positions. The term "horizontal" is defined as a plane parallel to a conventional plane of a semiconductor substrate, rather than its actual three-dimensional orientation in space. The terms "vertical" and "normal" refer to a plane perpendicular to the horizontal. The term "lateral" refers to a direction parallel to the horizontal plane.

Terms such as "connected" or "coupled" indicate that a feature may be directly connected or coupled to or with the other feature, or one or more intervening features may also be present. A feature may be "directly connected" or "directly coupled" to or with another feature if intervening features are absent. A feature may be "indirectly connected" or "indirectly coupled" to or with another feature if at least one intervening feature is present. Terms such as "on" or "contacting" indicate that a feature may be directly on or in direct contact with the other feature, or one or more intervening features may also be present. A feature may be "directly on" or in "direct contact" with another feature if intervening features are absent. A feature may be "indirectly on" or in "indirect contact" with another feature if at least one intervening feature is present.

The terms "first", "second", "third" and the like in the description and in the claims, if any, are used for distinguishing between similar elements and not necessarily for describing a particular sequential or chronological order as required. A method described herein is not necessarily limited in practice to the exact order or number of steps as have been listed, and certain steps may possibly be omitted and/or certain other steps not described herein may possibly be performed in actual practice. Terms such as "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A memory device comprising:
    a first electrode in an interlayer dielectric material, the interlayer dielectric material having a top surface;
    an oxygen scavenging layer on the first electrode and the top surface of the interlayer dielectric material;
    a hard mask on the oxygen scavenging layer, the hard mask having a side surface;
    a second electrode on the hard mask, the second electrode has a top surface; and
    a switching layer arranged on a portion of the oxygen scavenging layer, the switching layer having a first portion conformal to the side surface of the hard mask and a second portion arranged over the top surface of the second electrode.

2. The memory device of claim 1, wherein the switching layer is spaced apart from the first electrode by the oxygen scavenging layer.

3. The memory device of claim 1, wherein the second electrode has a side surface, and the first portion of the switching layer extends to at least partially cover the side surface of the second electrode.

4. The memory device of claim 1, wherein the first electrode is spaced apart from the second electrode by the hard mask and the oxygen scavenging layer.

5. The memory device of claim 1, wherein the hard mask has a top surface, the second electrode has a bottom surface in contact with the top surface of the hard mask, and the top surface of the hard mask is smaller than the bottom surface of the second electrode.

6. The memory device of claim 1, wherein the first electrode has a first width, the second electrode has a second width, and the first width is larger than the second width.

7. The memory device of claim 1, wherein the oxygen scavenging layer and the switching layer are comprised of different materials.

8. A memory device comprising:
    a first electrode in an interlayer dielectric material, the interlayer dielectric material having a top surface;
    a second electrode over the first electrode;
    a third electrode spaced from the first electrode and the second electrode;
    an oxygen scavenging layer on the first electrode, the third electrode and the top surface of the interlayer dielectric material;
    a hard mask on the oxygen scavenging layer and in contact with the second electrode, the hard mask having a side surface; and
    a switching layer arranged on a portion of the oxygen scavenging layer, the switching layer having a first portion conformal to the side surface of the hard mask.

9. The memory device of claim 8, wherein the switching layer is spaced apart from the first electrode by the oxygen scavenging layer.

10. The memory device of claim 8, wherein the second electrode has a side surface, and the first portion of the switching layer extends to cover the side surface of the second electrode.

11. The memory device of claim 8, wherein the second electrode has a top surface, and the switching layer has a second portion arranged over the top surface of the second electrode.

12. The memory device of claim 8, wherein the hard mask has a top surface, the second electrode has a bottom surface in contact with the top surface of the hard mask, and the top surface of the hard mask is smaller than the bottom surface of the second electrode.

13. The memory device of claim 8, wherein the second electrode is spaced apart from the first electrode and the third electrode by the hard mask and the oxygen scavenging layer.

14. The memory device of claim 8, wherein the switching layer has a width, and the first electrode is laterally displaced from the second electrode by not more than the width of the switching layer.

15. A method of fabricating a memory device comprising:
    forming a first electrode in an interlayer dielectric material, the interlayer dielectric material having a top surface;
    forming an oxygen scavenging layer on the first electrode and the top surface of the interlayer dielectric material;

forming a material stack comprising of a conductive material over a hard mask material on the oxygen scavenging layer;

patterning the material stack to form a second electrode over a hard mask, the hard mask having a side surface and the second electrode has a top surface; and forming a switching layer on a portion of the oxygen scavenging layer, wherein the switching layer has a first portion conformal to the side surface of the hard mask and a second portion arranged over the top surface of the second electrode.

16. The method of claim 15, further comprising a planarization process after forming the first electrode, to planarize a top surface of the first electrode and the interlayer dielectric material.

17. The method of claim 15, further comprising an etching process after the forming of the switching layer, the etching process shaping the switching layer to form a spacer structure adjacent to the side surface of the hard mask and the second electrode.

18. The memory device of claim 1, wherein the oxygen scavenging layer separates the first electrode from the second electrode and the hard mask.

19. The memory device of claim 1, wherein the first electrode has a top surface and the oxygen scavenging layer is on the top surface of the first electrode.

* * * * *